United States Patent
Schultz

(10) Patent No.: US 8,099,686 B2
(45) Date of Patent: Jan. 17, 2012

(54) CAD FLOW FOR 15NM/22NM MULTIPLE FINE GRAINED WIMPY GATE LENGTHS IN SIT GATE FLOW

(75) Inventor: Richard Schultz, Fort Collins, CO (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 337 days.

(21) Appl. No.: 12/412,722

(22) Filed: Mar. 27, 2009

(65) Prior Publication Data

US 2010/0248481 A1 Sep. 30, 2010

(51) Int. Cl.
*G06F 17/50* (2006.01)
(52) U.S. Cl. .......................... 716/55; 716/101; 716/110
(58) Field of Classification Search .................... 716/55, 716/101, 110
See application file for complete search history.

(56) References Cited

U.S. PATENT DOCUMENTS

| | | | |
|---|---|---|---|
| 5,770,493 A * | 6/1998 | Fulford, Jr. | 438/199 |
| 2003/0124847 A1* | 7/2003 | Houston et al. | 438/689 |
| 2005/0022151 A1* | 1/2005 | Rittman et al. | 716/19 |
| 2010/0169847 A1* | 7/2010 | Gupta et al. | 716/2 |

OTHER PUBLICATIONS

Johnson, Frank S., Methods for Fabricating Finfet Structures Having Different Channel Lengths, U.S. Appl. No. 12/365,300, Feb. 4, 2009.
Schultz, Richard T., Methods for Fabricating Finfet Structures Having Different Channel Lengths, U.S. Appl. No. 12/365,303, Feb. 4, 2009.

* cited by examiner

*Primary Examiner* — Suresh Memula
(74) *Attorney, Agent, or Firm* — Ditthavong Mori & Steiner, P.C.

(57) ABSTRACT

Methods are described for forming an integrated circuit having multiple devices, such as transistors, with respective element lengths. The methods include a new CAD flow for producing masks used for exposing sidewall spacers which are to be etched to a smaller base width than other sidewall spacers and which in turn are used as an etch mask to form gate structures with smaller element lengths than those formed from the other sidewall spacers. Embodiments include generating a schematic of an integrated circuit and a corresponding netlist, establishing design rules for the integrated circuit, generating a computer aided design layout for the integrated circuit, plural transistors of the integrated circuit respectively having different gate lengths, checking the integrated circuit layout and netlist for compliance with the established design rules and for correspondence with the generated schematic, and generating a mask with different openings that correspond to the integrated circuit layout, in response to a satisfactory outcome of the checking step.

11 Claims, 8 Drawing Sheets

CAD FLOW FOR 15NM/22NM MULTIPLE FINE GRAINED WIMPY GATE LENGTHS IN SIT GATE FLOW

TECHNICAL FIELD

The present disclosure relates to CAD based methods of fabricating semiconductor devices, and more particularly relates to CAD based methods for biasing gate lengths of individual gates via an additional resist mask.

BACKGROUND

In contrast to traditional planar metal-oxide-semiconductor field-effect transistors (MOSFETs), which are fabricated using conventional lithographic fabrication methods, nonplanar FETs incorporate various vertical transistor structures, and typically include two or more gate structures formed in parallel. One such semiconductor structure is the "FinFET," which takes its name from the multiple thin silicon "fins" that are used to form the respective gate channels, and which are typically on the order of tens of nanometers in width. The width of the gate in such transistors determines the effective channel length of the device.

Transistors with smaller channel lengths and smaller gate pitch exhibit higher current drive strength and less capacitance, and can operate at higher frequency, thus providing overall increased device performance. However, as semiconductor structures approach the 22 nanometer (nm) and 15 nm technology nodes, transistors with small channel lengths may suffer from static current leakage, with the static current leakage increasing as the channel length decreases. Further, processes for fabricating such small channel length transistors often result in high channel length variability, which can adversely affect transistor performance. While certain transistors in a semiconductor device may perform functions such as critical timing, and thus require short channel lengths, not all transistors of the structure will perform such functions. These transistors can be fabricated with wider channel lengths, thus overcoming leakage problems and fabrication variability. In addition it might be desirable to have N-channel and P-channel transistors of different channel lengths due to the difference in junction abruptness, charge carrier mobility, and gate electrode work function. Therefore, it is desirable to form semiconductor structures with gate structures of different widths. However, because of the very small tolerances involved, current methods for fabricating such structures are difficult.

One technique for creating various gate lengths on final lithographically printed and etched gates in a bulk or silicon-on-insulator (SOI) silicon wafer process is called pitch splitting. Pitch splitting is a technique that uses two masks to create a pitch that is half as big as the original. Half the data is put on one mask and the other half of the data is put on a second mask. The channel length scaling must be accomplished on each split pitch mask by adding a wider drawn channel length on selected devices during optical proximity correction (OPC). The two masks are each exposed to generate a composite photo image of the final pattern on a resist. The patterned resist is then used to etch the final pattern into the semiconductor wafer. This process is expensive due to the use of two masks. Also, since two masks are needed to produce the final image, the alignment tolerance between the two masks becomes an issue, which in turn affects the final design rules, resulting in less dense design rules. Further, with a two mask dual exposure, there is no guarantee that both exposures will be the same and will deliver the same nominal target for the minimum channel length devices or the channel length scaled devices.

In addition, since gate length scaling on traditional split pitch approaches is based on two OPC adjusted masks, the gate length scaled devices cannot be adjusted without affecting the minimum channel devices since they are exposed by the lithographic stepper simultaneously. Also, the optical proximity corrected masks themselves may have different critical dimensions (CDs) since they are generated separately. The combination of being generated separated and exposed separately may lead to bimodal distributions of channel lengths on every other transistor.

Conventional gate length scaling via pitch splitting is controlled by a schematic and graphic design system (GDS) based computer aided design (CAD) flow to describe which gates acquire the additional CD bias. For example, Blaze DFM provides a CAD based solution to effectively bias the gate length of individual gates. The Blaze DFM CAD flow involves schematic capture, netlisting, simulation, and mask data preparation to resize the gates on a mask to lithographically print wider or narrower gate lengths. The bias can be applied to one or more gates within the flow. A CAD recognition layer is drawn over the gate, and the mask is then modified during an OPC mask data preparation step. The schematic contains the gate sizing information for each gate. The amount of upsizing or downsizing is controlled by the CAD flow, and the data is sent to the mask shop showing the device coordinate and the amount of retargeting to be applied to each side of the gate. At this point, the gate resizing is fixed on the mask, and all devices are controlled by final resist exposure and etch. In the case of split pitch mask processing, this approach must be done on each corresponding split pitch mask for each gate. Accordingly, for every new product in which the gates are resized, new OPC mask data must be prepared and new masks created.

Another technique for creating various gate lengths is a sidewall image transfer (SIT) process. SIT based processing can be used for very regular patterns such as a grating pattern (a repeating pattern of lines all at the same pitch). SIT processing utilizes one photomask printed at twice the desired pitch to create mandrels. Then a spacer is formed on each side of each mandrel, the mandrels are removed, and the spacers left behind define two lines at the desired pitch (which is half of the original pitch). The SIT gate spacer process typically produces a non-lithographically defined, uniform gate length across the wafer, with the gate length being a function of the spacer bottom wall width. Since the spacer width and original mandrel pitch set the feature sizes of interest, no channel length scaling is possible with a simple SIT based flow.

Most often, short gate lengths at minimum spacing are required to support the typical logic gate layout and density. However, short gates have a greater variability in gate length and in the related transistor performance. Also, short gates have a high local variation, mismatch, and global variation of transistor parameters due to increased sensitivity to line edge roughness and dopant variation. In addition, whereas low power mobile platforms or battery backup systems are generally needed to reduce static current in order to lengthen battery operation times, channel length scaling would help reduce the static leakage on non critical timing paths. Channel length scaling could also be used on non critical timing paths to reduce total power. Memory bit cells often use extended gate lengths to provide better bit cell stability due to random dopant fluctuation in the channel and to reduce the effects of line edge roughness (LER).

A need therefore exists for methods which can produce multiple fine grained gate lengths on a single substrate using SIT processing with a corresponding CAD flow.

SUMMARY

An aspect of the present disclosure is a CAD flow for forming a mask used in a SIT process for producing multiple element lengths in an integrated circuit.

Additional aspects and other features of the present disclosure will be apparent to those having ordinary skill in the art upon consideration of the following According to the present disclosure, a schematic of an integrated circuit containing a plurality of components having different element lengths and a corresponding netlist can be generated. Design rules for the integrated circuit are then established, and a computer aided design layout for the integrated circuit is generated. The integrated circuit layout and netlist are checked for compliance with the established design rules and for correspondence with the generated schematic. A mask comprising different elements that correspond to the integrated circuit layout is then generated in response to a satisfactory outcome of the checking step.

The plurality of components may comprise transistors having different gate lengths. The computer aided design layout may determine the different gate lengths by optimizing timing slack on a particular path in the layout of the integrated circuitor by optimizing margin in the layout. Evaluation of total power budget may be included in this process.

Compliance of the integrated circuit layout and netlist may be repeatedly checked and the computer aided design layout modified until a satisfactory outcome is attained. A mask is generated by forming openings in the mask corresponding to at least first positions of first gate lengths, but not second positions of second gate lengths, in the integrated circuit layout.

A plurality of mandrels may be formed, e.g., to produce an integrated circuit having a plurality of transistors, on a hard mask layer overlying a gate-forming material. Each mandrel comprises a top and two sides portions. A sidewall spacer material layer is deposited to form a first thickness over the tops and sides of the plurality of mandrels and over the hard mask layer. A photoresist material is then deposited over the sidewall spacer material layer. Optionally, a blanket anisotropic etch may be performed before the photoresist material is deposited. Portions of the photoresist material are exposed using the generated mask and then removed to expose a portion of the sidewall spacer material layer. The exposed sidewall spacer material layer is then partially etched to a second thickness less than the first thickness. The remaining photoresist material, the sidewall spacer material on the hard mask layer and on the tops of the mandrels, and the mandrels are then removed, thereby forming first sidewall spacers with a base width equal to the second thickness at the first positions and second sidewall spacers with a base width equal to the first thickness at the second positions.

The hard mask layer may be etched using the first and second sidewall spacers as an etch mask. The sidewall spacers are removed, and the underlying gate-forming material is etched using the etched hard mask layer as an etch mask. The remaining hard mask layer is then removed.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1A:
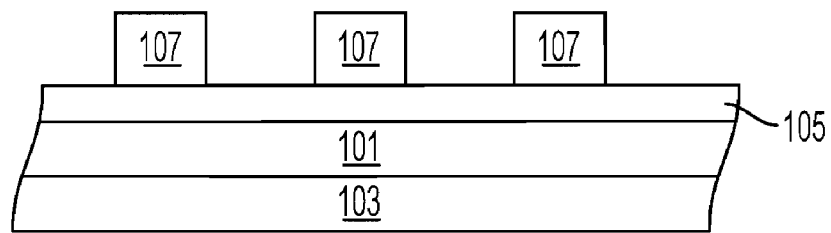
FIGS. 1A-1E illustrate a conventional SIT process for forming gate structures of FETs.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments.

The present disclosure addresses and solves problems, for example, in forming multiple gate lengths, such as bimodal CD distribution from two mask exposures, poor gate length control due to poor registration between masks, complicated OPC processing, and the need for a new mask for each channel length adjustment. In accordance with embodiments of the present disclosure, a schematic of an integrated circuit containing a plurality of components and a corresponding netlist are generated, design rules for the integrated circuit are established, a computer aided design layout for the integrated circuit is generated, with the plurality of components respectively having different element lengths, the integrated circuit layout and netlist are checked for compliance with the established design rules and for correspondence with the generated schematic, and a mask is generated in response to a satisfactory outcome of the checking step, with the mask comprising different elements that correspond to the integrated circuit layout. The plurality of components may comprise transistors, with the different lengths corresponding to gates of the transistors. The step of generating a computer aided design layout may include determining the different gate lengths by optimizing timing slack on a particular path in the layout of the integrated circuit. The determination step may include optimizing margin in the layout and/or evaluating total power budget. In response to an unsatisfactory outcome of the checking step, the steps of generating a computer aided design layout and checking may be repeated until a satisfactory outcome of checking is attained. Finally, a mask may be generated with openings in the mask corresponding to at least first positions of first gate lengths, but not second positions of second gate lengths, in the integrated circuit layout. The CAD flow for producing the masks does not require OPC processing, as the final gate size is not set on the mask.

In accordance with embodiments of the present disclosure the generated mask may be used to form plural gate lengths on a substrate. According to the methods, a plurality of mandrels are formed on a hard mask layer overlying a gate-forming material, each mandrel having a top and two sides, a sidewall spacer material layer is deposited to a first thickness over the tops and sides of the plurality of mandrels and over the hard mask layer, a photoresist material is deposited over the sidewall spacer material layer, portions of the photoresist material are exposed using the generated mask, the exposed photoresist material is used to expose a portion of the sidewall spacer material layer, the exposed sidewall spacer material layer is partially etched to a second thickness less than the first thickness, and the remaining photoresist material, the sidewall spacer material on the hard mask layer and on the tops of the mandrels, and the mandrels are all removed. The resulting structure includes first sidewall spacers with a base width equal to the second thickness at the first positions and second sidewall spacers with a base width equal to the first thickness at the second positions.

After the spacers are formed, the sidewall spacer may be used as an etch mask to etch the underlying hard mask layer. Then, the sidewall spacers may be removed, and the etched hard mask layer may be used as an etch mask to etch the underlying gate-forming material. The remaining hard mask layer may then be removed leaving behind gate with two different gate lengths.

According to other embodiments of the present disclosure, a plurality of mandrels is formed on a hard mask layer overlying a gate-forming material, each mandrel having a top and two sides, a sidewall spacer material layer is deposited over the tops and sides of the plurality of mandrels and over the hard mask layer, a blanket anisotropic etch is performed, thereby forming sidewall spacers with a first base width, a photoresist material is deposited over the sidewall spacer material layer, portions of the photoresist material are exposed using the generated mask, the exposed photoresist material is removed to expose a portion of the sidewall spacers, the exposed sidewall spacers are partially etched to a second base width less than the first base width, and the remaining photoresist material is removed.

The sidewall spacers may then be used as an etch mask to etch the hard mask layer. The sidewall spacers may then be removed, the underlying gate-forming material may be etched using the etched hard mask layer as an etch mask, and the remaining hard mask layer may be removed.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1B:
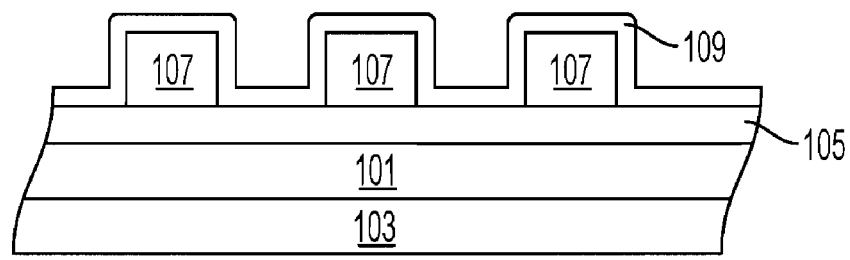
Figure 1C:
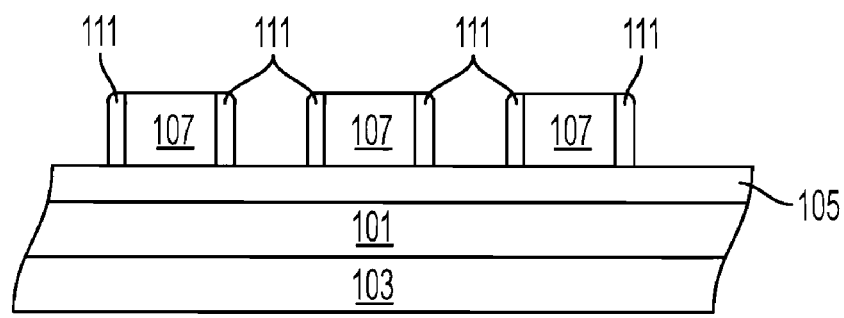

FIGS. 1A-1E depict a conventional SIT process. As illustrated in FIG. 1A, a gate layer 101 is formed on a substrate 103 of a suitable gate material. A hard mask layer 105, for example an oxide or nitride, is formed on gate layer 101. Next, a pattern of mandrels 107 are formed on the hard mask layer 105. The mandrels are formed, for example, of polysilicon, and are produced with a width and pitch that will place spacers, which are used to create the gates, in the correct positions. In FIG. 1B, a spacer liner layer 109 is deposited over the mandrels 107 and the hard mask layer 105. Spacer liner layer 109 is formed of a nitride or an oxide (the inverse of the hard mask layer 105), for example, with a thickness equal to the desired gate length, adjusted for process biases. Reactive ion etching is then performed on spacer liner layer 109 to form spacers 111, as illustrated in FIG. 1C. The size of the base of the spacers 111 matches the desired gate length.

Figure 1D:
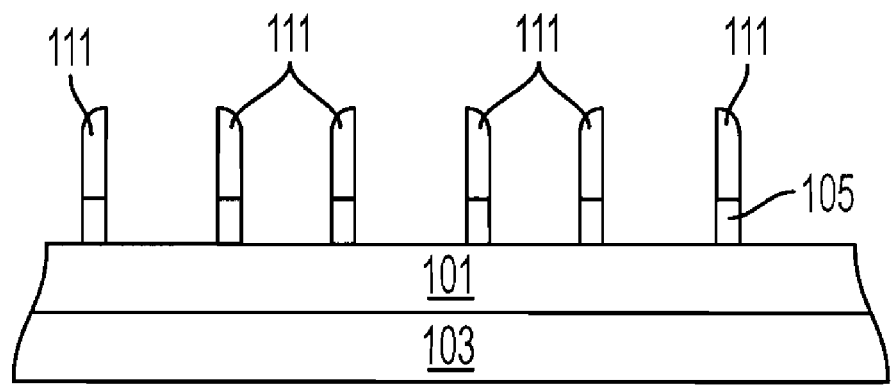
Figure 1E:
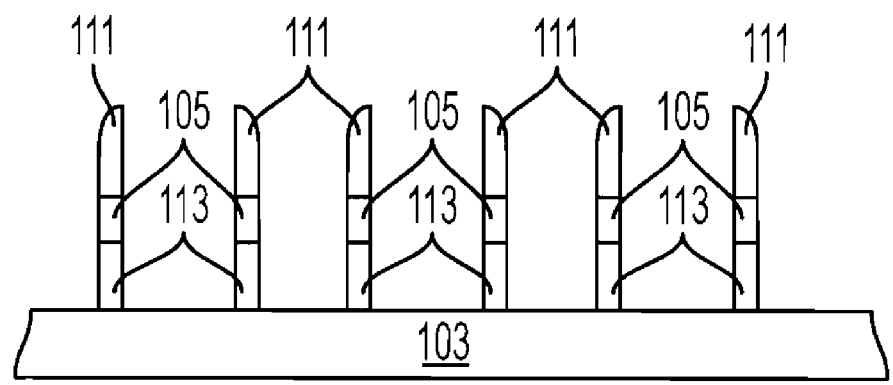

Mandrels 107 are removed, and spacers 111 are used as a mask to pattern hard mask layer 105 (FIG. 1D). Gate layer 101 is then patterned using the spacers 111 and patterned hard mask layer 105 as a mask. The remaining hard mask layer 105 and spacers 111 are then removed, leaving behind gates 113 on substrate 103. Gates 113 all have the same gate length.

A method of forming a gate structure of FETs with different gate lengths is illustrated in FIGS. 2A-2H. The methods include the formation of sidewall spacers of different thicknesses to define the gate lengths. By depositing sidewall spacer material of a uniform thickness and subsequently refining that thickness in regions where gate structures of smaller gate length are desired, sidewall spacers of smaller and larger thickness can be fabricated and subsequently used as an etch mask so that gate structures with small and large gate lengths can be formed simultaneously. In this regard, as different photoresist masks are not used to define the gate structures having different gate lengths, less variability among the minimum channel lengths of the resulting FET structures and better gate structure alignment can be achieved. In addition, as gate structures with larger lengths can be fabricated along with small length gate structures needed for critical timing paths, static leakage and power consumption of the resulting semiconductor structure can be decreased.

Figure 2A:
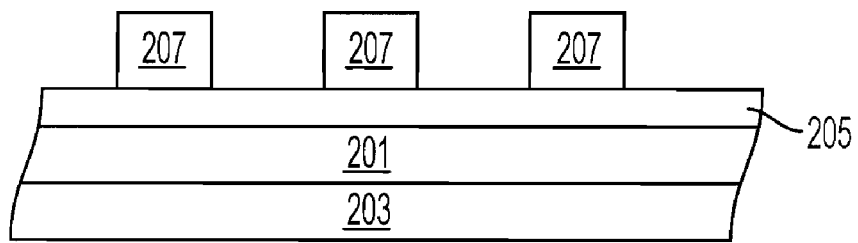
FIGS. 2A-2H illustrate a method for fabricating gate structures of FETs having different widths, in accordance with exemplary embodiments of the present disclosure.

Referring to FIG. 2A, in accordance with an exemplary embodiment, a method for fabricating FET gate structures includes the step of forming a gate layer 201 on a substrate 203 and a hard mask layer 205 on the gate layer 201. The gate layer is deposited as a blanket layer over a semiconductor substrate. As used herein, the term "semiconductor substrate" will be used to encompass semiconductor materials conventionally used in the semiconductor industry from which to make electrical devices. Semiconductor materials include monocrystalline silicon materials, such as the relatively pure or lightly impurity doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity doped germanium, gallium arsenide, zinc oxide, glass, and the like. The semiconductor material is preferably a silicon substrate. The silicon substrate may be a bulk silicon wafer or a buried oxide layer disposed on a support substrate such as either N-type or P-type silicon.

The gate layer 201 comprises a conductive material, such as, for example, polycrystalline silicon, one or more metals, or a combination thereof, and has a thickness suitable for a desired device application. Hard mask layer 205 comprises any suitable mask material that exhibits a lower etch rate than the gate layer 201 when subjected to the same etch chemistry. In this regard, adequate control of the gate forming etch process, discussed in more detail below, can be achieved. The hard mask layer 205 can be, for example, a layer of oxide or nitride, e.g., silicon oxide or silicon nitride. Silicon nitride can be deposited, for example, by LPCVD by the reaction of dichlorosilane and ammonia.

A plurality of mandrels 207 are formed on the hard mask layer 205. In one exemplary embodiment, the mandrels are formed with uniform width. The mandrels are formed by depositing a layer of mandrel forming material on the hard mask layer 205. The mandrel forming material comprises a material having a composition different from that of the hard mask layer 205 so as to achieve high mandrel to hard mask layer selectivity. Examples of suitable materials for the mandrel forming material include, but are not limited to, photoresist, polycrystalline silicon, silicon oxide, silicon nitride, and the like. In a preferred embodiment, the mandrel forming material comprises polycrystalline silicon. After deposition of the layer of mandrel forming material, a patterned mask (not shown), such as a patterned photoresist, is formed on the mandrel forming material, which then is etched to form mandrels 207. The patterned mask is removed after etching the mandrels 207.

Figure 2B:
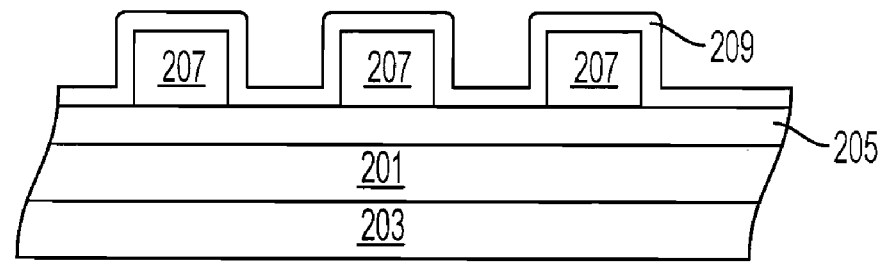

After formation of mandrels 207, a spacer liner layer 209 is uniformly and conformably deposited overlying the mandrels 207, as illustrated in FIG. 2B. The spacer liner layer 209 comprises a material having a composition different from that of the mandrel forming material and hard mask layer to achieve high mandrel to spacer etch selectivity. Materials suitable for spacer liner layer 209 include, for example silicon nitride and silicon oxide, the inverse of the hard mask layer 205. Preferably the spacer liner layer 209 comprises a silicon oxide. Sidewall spacers subsequently formed from the spacer liner layer 209 serve to define the dimensions of subsequently fabricated gate structures and, hence, the channel lengths of corresponding FET structures. In this regard, the spacer liner layer 209 is deposited to a thickness that, along with the height of the mandrels 207 and the sidewall spacer etch process parameters, forms sidewall spacers with widths that correspond to the length of the widest gate structure to be fabricated. Methods for defining sidewall spacer widths are well known in the art and, thus, will not be discussed further herein.

Figure 2C:
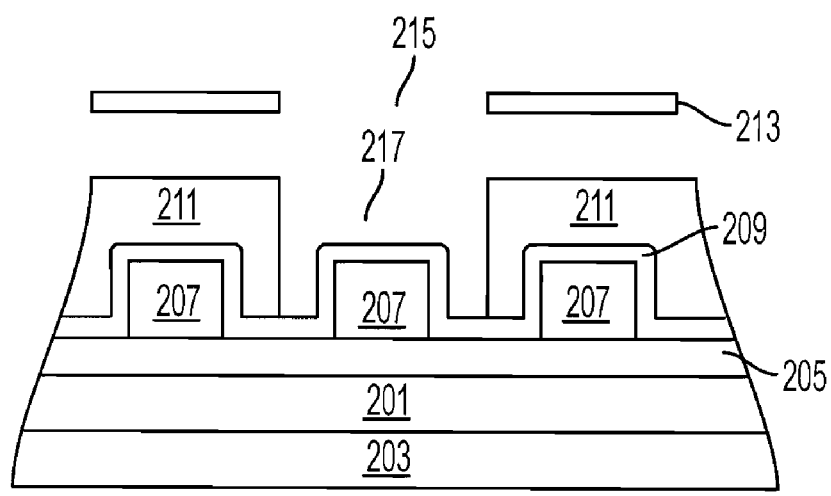
Figure 3:
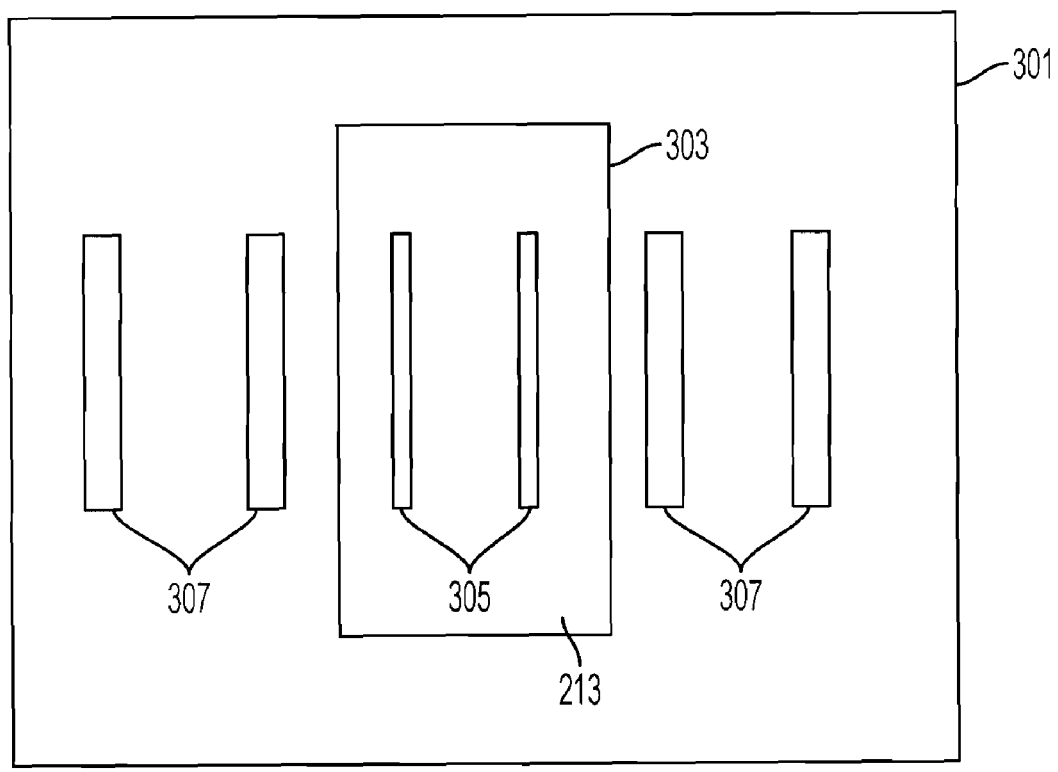
FIG. 3 illustrates a top view of a mask in accordance with exemplary embodiments of the present disclosure.

Referring to FIG. 2C, in one exemplary embodiment, after deposition of the spacer liner layer 209, a photoresist 211 is formed over the entire spacer liner layer 209. The photoresist is patterned with a mask 213 having openings 215. A top view of mask 213 is shown in FIG. 3, and the formation of mask 213 will be described in more detail below. Openings 215 in the mask allow a portion 217 of the photoresist to be removed. Portion 217 corresponds to the locations where smaller gate lengths are desired and a portion of the surrounding area, but does not include locations where larger gate lengths are desired. As illustrated in FIG. 3, mask 301 has opening 303, which exposes positions 305 where smaller gate lengths are to be formed, but not positions 307 where larger gate lengths will be formed.

Figure 2D:
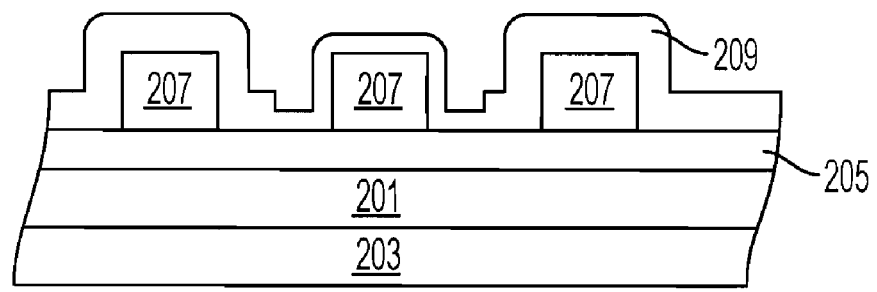
Figure 2E:
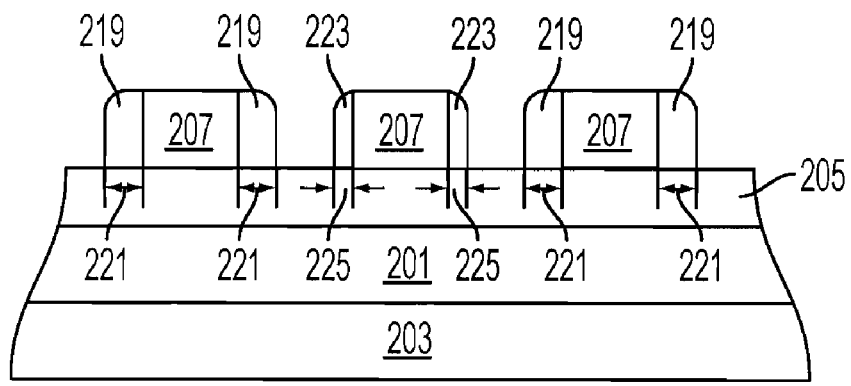

Turning to FIG. 2D, the exposed spacer liner layer 209 is then partially etched, so that the exposed spacer liner layer 209 has a thickness corresponding to the desired smaller gate length. The photoresist 211 is then removed. Referring to FIG. 2E, a blanket anisotropic etch is then performed to obtain a first set of spacers 219 with a base width (i.e., a width closest to the hard mask layer 205) 221 and a second set of spacers 223 with base width 225. Base width 221 corresponds to the desired larger gate length and base width 225 corresponds to the desired smaller gate length. Although the fabrication of gate structures of only two gate lengths is illustrated in FIGS. 2A-2H, it will be appreciated that the disclosure is not so limited, and gate structures of three, four, and more gate lengths can be fabricated. Accordingly, the steps of patterning photoresist 211 and partially etching spacer liner layer 209 can be repeated multiple times to obtain sidewall spacers of multiple widths.

Figure 5A:
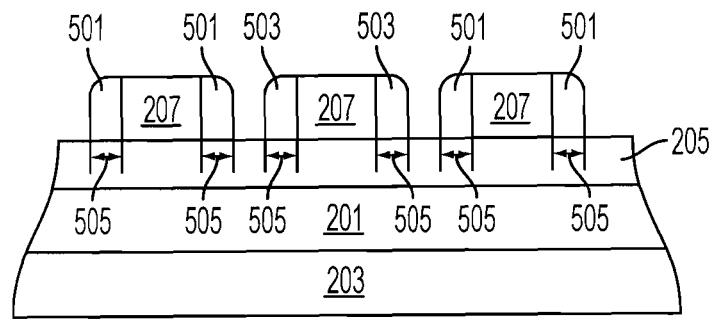
FIGS. 5A-5C illustrate an alternative exemplary embodiment for fabricating gate structures of FETs having different widths.
Figure 5B:
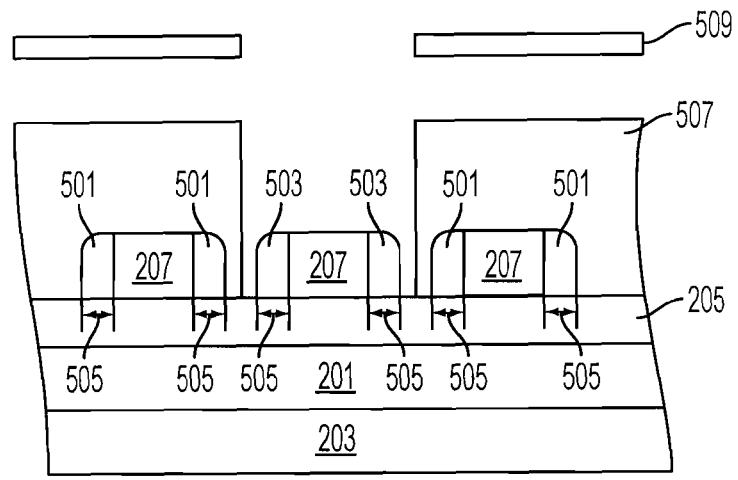
Figure 5C:
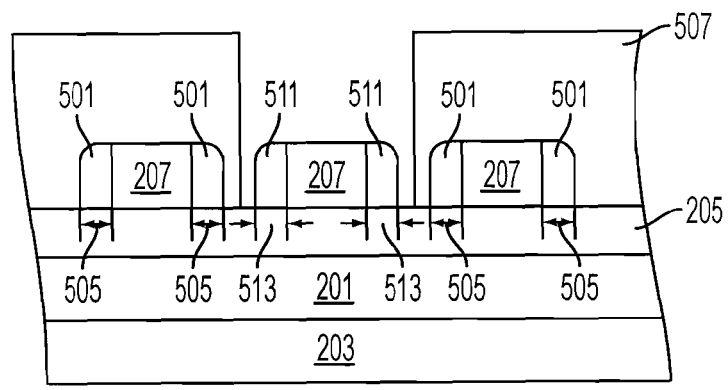

Referring momentarily to FIG. 5A, in an alternative embodiment, after deposition of the spacer liner layer 209 as illustrated in FIG. 2B, a blanket anisotropic etch is performed to obtain sidewall spacers 501 and 503 of uniform base width 505 which corresponds to the desired larger gate length. Photoresist 507 is then formed over mandrels 207 and sidewall spacers 501 and 503 and is patterned with a mask 509 (the same as mask 213 in FIG. 2C). In this regard, the photoresist is removed from sidewall positions 503 (where smaller gate lengths are desired) and part of the surrounding area, as illustrated in FIG. 5B. The exposed sidewall spacers 503 are then further partially etched, as illustrated in FIG. 5C, to obtain sidewall spacers 511 having base widths 513 that correspond to the desired smaller gate lengths. Then, the photoresist 507 is removed. Again, the fabrication of only two gate lengths is illustrated in the figures, but it will be appreciated that the disclosure is not so limited. Accordingly, the steps of forming uniform sidewall spacers, forming a patterned photoresist, and partially etching the sidewall spacers can be repeated multiple times to obtain sidewall spacers of multiple widths.

Figure 2F:
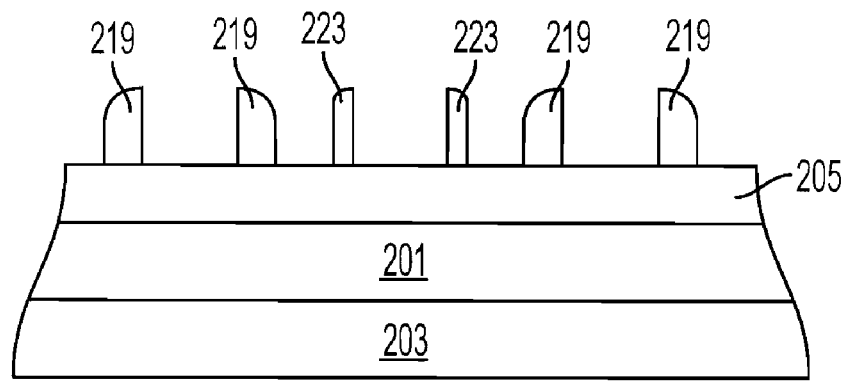
Figure 2G:
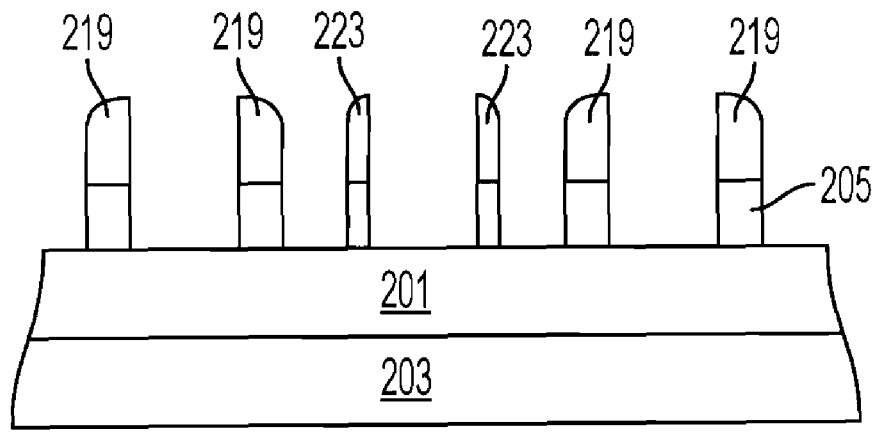
Figure 2H:
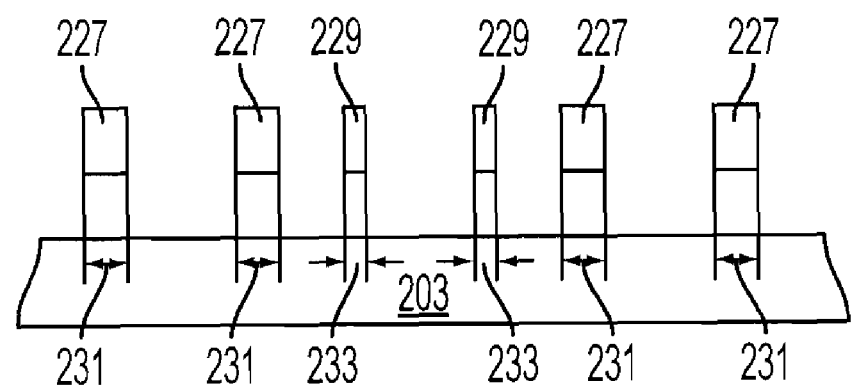

Referring to FIG. 2F, after formation of the sidewall spacers 219 and 223, the mandrels 207 are removed using an etch chemistry suitable for etching the mandrels while leaving the sidewall spacers in tact. Using the sidewall spacers 219 and 223, as an etch mask, the hard mask layer 205 is etched, as illustrated in FIG. 2G. In one exemplary embodiment, the sidewall spacers 219 and 223 are then removed from the etched hard mask layer 205 such that the aspect ratio of etched hard mask layer 205 will be less than the aspect ratio of the sidewall spacers and the etched hard mask layer 205 combined. In this regard, maximum control of the subsequent etching of the gate layer 201 can be achieved so as to accurately transfer the width of the hard mask layer to the gate structures. Next, as illustrated in FIG. 2H the etched hard mask layer is used as an etch mask during the etching of the gate layer 201 to form gate structures 227 and 229 having widths 231 and 233, respectively. The etched hard mask layer 205 is then removed, and, thereafter, known process steps can be performed to complete fabrication of the FET structures.

Figure 4:
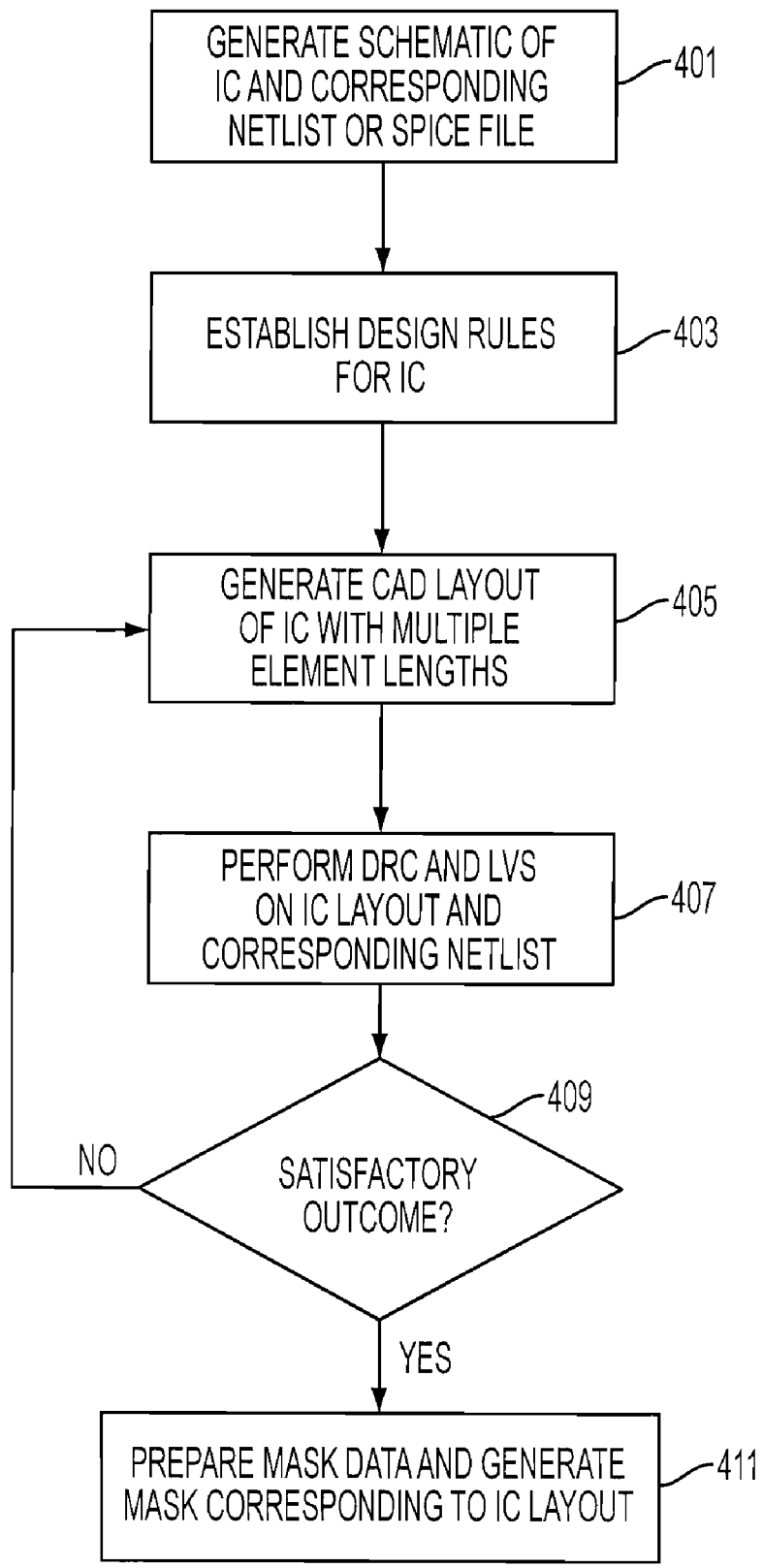
FIG. 4 is a flowchart of the process for forming a mask in accordance with exemplary embodiments of the present disclosure.

The mask 213 used to pattern the photoresist in FIG. 2C will now be described with respect to the flowchart shown in FIG. 4. First, in step 401, a schematic of an integrated circuit (IC) is generated with a symbol for the two gate sizes, and a corresponding netlist or SPICE file containing the resized devices is generated. A symbol would be generated for p-channel as well as for n-channel devices. SPICE models may be generated to support any gate resizing to be used in a future product, based on process capability and the tradeoff between leakage and Ieff or Idsat. The SPICE models are then identified by the amount of resizing and can be called by the CAD flow to characterize standard library cells or custom cells. From the gate biased characterization flow, timing and power libraries can be generated for various industry standard timing and power models.

Design rules are established for the IC in step 403. A CAD GDS recognition layer, i.e., the format for the IC layout data, is drawn over the corresponding biased gate (step 405). Some gates will be left at minimum and may contain different Vt offerings. Some gates may have a wider gate length than minimum and may also contain different Vt offerings. The combination of minimum gate, non minimum gate, and Vt offerings are determined by an optimization routine that does replacements based on timing slack or margin on that particular path. A goal of this routine is to make the combination of replacements be the lowest possible total power budget based on frequency and switching activity and static power draw. In other words, the routine can balance the selection of minimum gate and wide gate devices and the various Vt offerings. The number of wider gate selections in a path will vary from path to path based on timing slack. Additional guard banding may be added to this process to guarantee that paths that were not critical timing paths do not become critical timing paths (very poor timing slack or margin) after the replacements are made.

In step 407, design rule checking (DRC) and layout versus schematic (LVS) checking is performed on the GDS and corresponding netlist to verify that the GDS recognition layer and gate sizing for the netlist is correct. (It will be necessary to check that the GDS sizing layer corresponds to the proper gate sizing if more than one gate sizing operation exists and more than one gate sizing layer exists. The same check must also be implemented for LVS.) The gate size on the corresponding GDS and on the final OPC mask plate are not resized with respect to the gate sizing specified in the netlist or SPICE file. If the GDS and netlist do not produce satisfactory results for the DRC and LVS checks, at step 409 the process returns to step 405 to generate a new CAD layout and to perform the DRC and LVS checks (step 407) once again. On the other hand, if satisfactory results are obtained from the DRC and LVS checks, mask data is prepared and the a new mask corresponding to the final gate sizing (i.e., the final GDS) is generated at step 411. The new mask for the gate sizing is then used in the process and formation of the spacer width.

The above described process differs from the traditional OPC based approach. In the OPC based approach, a fixed amount of bias is created on each gate. Once the gate mask is generated, all devices will move together with respect to each mask (in the case of pitch splitting), corresponding exposure, and final single blanket gate etch. Resizing the gate lengths requires a whole new process and the formation of new masks. This new CAD based approach allows for gate length sizing that can be used to independently size the minimum devices and the resized gates during wafer processing without the need to generate a new gate mask plate. The amount of sizing can be adjusted for a given product at any time throughout its life cycle without the need to buy a new mask. Product performance and power can now be adjusted during the CPU optimization process. New simulations for verification can be generated at any time by choosing the appropriate combination of timing and power libraries or corresponding SPICE library files and the amount of gate sizing. Additional implant optimization and mask based gate spacer sizing can continue throughout the process node and can be run on the same original mask set.

The embodiments of the present disclosure can achieve several technical effects, including gate length sizing during wafer processing without OPC processing or the need to generate a new gate mask plate. The present disclosure enjoys industrial applicability in fabricating any of various types of highly integrated semiconductor devices with multiple gate lengths.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   generating a schematic of an integrated circuit containing a plurality of components and a corresponding netlist;
   establishing design rules for the integrated circuit,
   generating a computer aided design layout for the integrated circuit, the plurality of components respectively having different element lengths;
   checking the integrated circuit layout and netlist for compliance with the established design rules and for correspondence with the generated schematic; and
   generating a mask comprising different elements that correspond to the integrated circuit layout, in response to a satisfactory outcome of the checking step, by forming openings in the mask corresponding to at least first positions of first gate lengths, but not second positions of second gate lengths, in the integrated circuit layout,
   wherein the plurality of components comprises transistors and the different lengths correspond to gates of the plurality of transistors.

2. The method according to claim 1, wherein the step of generating a computer aided design layout comprises:
   determining the different gate lengths by optimizing timing slack on a particular path in the layout of the integrated circuit.

3. The method according to claim 2, wherein the step of determining further comprises optimizing margin in the layout.

4. The method according to claim 2, wherein the step of determining further comprises evaluating total power budget.

5. The method according to claim 2, comprising:
   in response to an unsatisfactory outcome of the checking step, repeating the steps of generating a computer aided design layout and checking until a satisfactory outcome of checking is attained.

6. The method according to claim 1, comprising:
   forming a plurality of mandrels on a hard mask layer overlying a gate-forming material, each mandrel having a top and two sides;
   depositing a sidewall spacer material layer to a first thickness over the tops and sides of the plurality of mandrels and over the hard mask layer;
   depositing a photoresist material over the sidewall spacer material layer;
   exposing portions of the photoresist material using the generated mask;
   removing the exposed photoresist material to expose a portion of the sidewall spacer material layer;
   partially etching the exposed sidewall spacer material layer to a second thickness less than the first thickness; and
   removing the remaining photoresist material, the sidewall spacer material on the hard mask layer and on the tops of the mandrels, and the mandrels,
   thereby forming first sidewall spacers with a base width equal to the second thickness at the first positions and second sidewall spacers with a base width equal to the first thickness at the second positions.

7. The method according to claim 6, further comprising:
   etching the hard mask layer using the first and second sidewall spacers as an etch mask.

8. The method according to claim 7, further comprising:
   removing the sidewall spacers;
   etching the underlying gate-forming material using the etched hard mask layer as an etch mask; and
   removing the remaining hard mask layer.

9. The method according to claim 1, comprising:
forming a plurality of mandrels on a hard mask layer overlying a gate-forming material, each mandrel having a top and two sides;
depositing a sidewall spacer material layer over the tops and sides of the plurality of mandrels and over the hard mask layer;
performing a blanket anisotropic etch, thereby forming sidewall spacers with a first base width;
depositing a photoresist material over the sidewall spacer material layer;
exposing portions of the photoresist material using the generated mask;
removing the exposed photoresist material to expose a portion of the sidewall spacers;
partially etching the exposed sidewall spacers to a second base width less than the first base width; and
removing the remaining photoresist material;
thereby forming first sidewall spacers with a first base width at the second positions and second sidewall spacers with a second base width at the first positions.

10. The method according to claim 9, further comprising:
etching the hard mask layer using the first and second sidewall spacers as an etch mask.

11. The method according to claim 10, further comprising:
removing the sidewall spacers;
etching the underlying gate-forming material using the etched hard mask layer as an etch mask; and
and removing the remaining hard mask layer.

* * * * *